(12) United States Patent
Gupta (10) Patent No.: US 8,664,100 B2
(45) Date of Patent: Mar. 4, 2014

(54) MANUFACTURING HIGH EFFICIENCY SOLAR CELL WITH DIRECTIONAL DOPING

(75) Inventor: Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 131 days.

(21) Appl. No.: 13/175,298

(22) Filed: Jul. 1, 2011

(65) Prior Publication Data

US 2012/0006392 A1  Jan. 12, 2012

Related U.S. Application Data

(60) Provisional application No. 61/361,959, filed on Jul. 7, 2010, provisional application No. 61/371,930, filed on Aug. 9, 2010.

(51) Int. Cl.
*H01L 21/425* (2006.01)
*H01L 31/18* (2006.01)

(52) U.S. Cl.
USPC .............................. 438/549; 438/98; 438/525

(58) Field of Classification Search
USPC .......................................... 438/524, 525, 549
See application file for complete search history.

(56) References Cited

U.S. PATENT DOCUMENTS

| 5,704,992 | A | | 1/1998 | Willeke et al. | |
|---|---|---|---|---|---|
| 6,147,297 | A | * | 11/2000 | Wettling et al. | 136/256 |
| 7,336,376 | B2 | * | 2/2008 | Munzer | 356/625 |
| 7,820,460 | B2 | | 10/2010 | Sullivan et al. | |
| 7,820,985 | B2 | | 10/2010 | Gupta et al. | |
| 7,868,305 | B2 | | 1/2011 | Gupta et al. | |
| 2009/0308450 | A1 | * | 12/2009 | Adibi et al. | 136/256 |
| 2010/0126569 | A1 | * | 5/2010 | Oh et al. | 136/255 |
| 2010/0300518 | A1 | * | 12/2010 | Moslehi et al. | 136/255 |
| 2010/0304522 | A1 | | 12/2010 | Rana et al. | |
| 2011/0156045 | A1 | * | 6/2011 | Higashi et al. | 257/66 |
| 2012/0006392 | A1 | * | 1/2012 | Gupta | 136/255 |

FOREIGN PATENT DOCUMENTS

DE  4033658 A1  4/1992
DE  19522539 A1  1/1997

OTHER PUBLICATIONS

Mark B. Spitzer et al., High-Efficiency Ion-Implanted Silicon Solar Cells, IEEE Transactions on Electron Devices, pp. 546-550, vol. ED-31, No. 5, May 1984.
C.J. Keavney & M.B. Spitzer, Solar Cell Junction Profiles in Ion-Implanted Texture-Etched Surfaces, J. Appl. Phys., pp. 592-593, 56 (2), Jul. 15, 1984.
Cuevas, A. ,et al., 26-Percent Efficient Point-Junction Concentrator Solar Cells With Afront Metal Grid, IEEE Electron Device Letters, Jan. 1, 1990, pp. 6-8, vol. 11, No. 1, IEEE Service Center, New York, New York, US.

* cited by examiner

*Primary Examiner* — David Vu
*Assistant Examiner* — Earl Taylor (57) ABSTRACT

A first facet of each of a plurality of pyramids on a surface of a workpiece is doped to a first dose while a second facet and a third facet of each of the plurality of pyramids is simultaneously doped to a second dose different than the first dose. The first facets may enable low resistance contacts and the second and third facets may enable higher current generation and an improved blue response. Ion implantation may be used to perform the doping.

18 Claims, 8 Drawing Sheets

MANUFACTURING HIGH EFFICIENCY SOLAR CELL WITH DIRECTIONAL DOPING

CROSS-REFERENCE TO RELATED APPLICATIONS

This application claims priority to the provisional patent application entitled "Manufacturing High Efficiency Solar Cells with Directional Doping," filed Jul. 7, 2010 and assigned U.S. application No. 61/361,959, and the provisional patent application entitled "Manufacturing High Efficiency Solar Cells with Directional Doping," filed Aug. 9, 2010 and assigned U.S. application No. 61/371,930, the disclosures of which are hereby incorporated by reference.

FIELD

This invention relates to doping solar cells and, more particularly, to doping solar cells using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduction in the cost to manufacture solar cells or any efficiency improvement to solar cells would have a positive impact on the implementation of solar cells worldwide. This will accelerate the adoption of solar cells as a clean energy technology.

There are several different solar cell architectures. One common design is the selective emitter (SE) solar cell. A SE solar cell has lightly-doped regions to enable lower current recombination as well as heavily-doped regions that enable current collection through low resistance contacts and minimize resistive losses. There are several techniques for the fabrication of such SE solar cells using doped inks, selective diffusions, laser doping, or patterned ion implantation. However, all of these techniques rely on some method of masking to enable selective doping on the SE solar cell surface.

Figure 1:
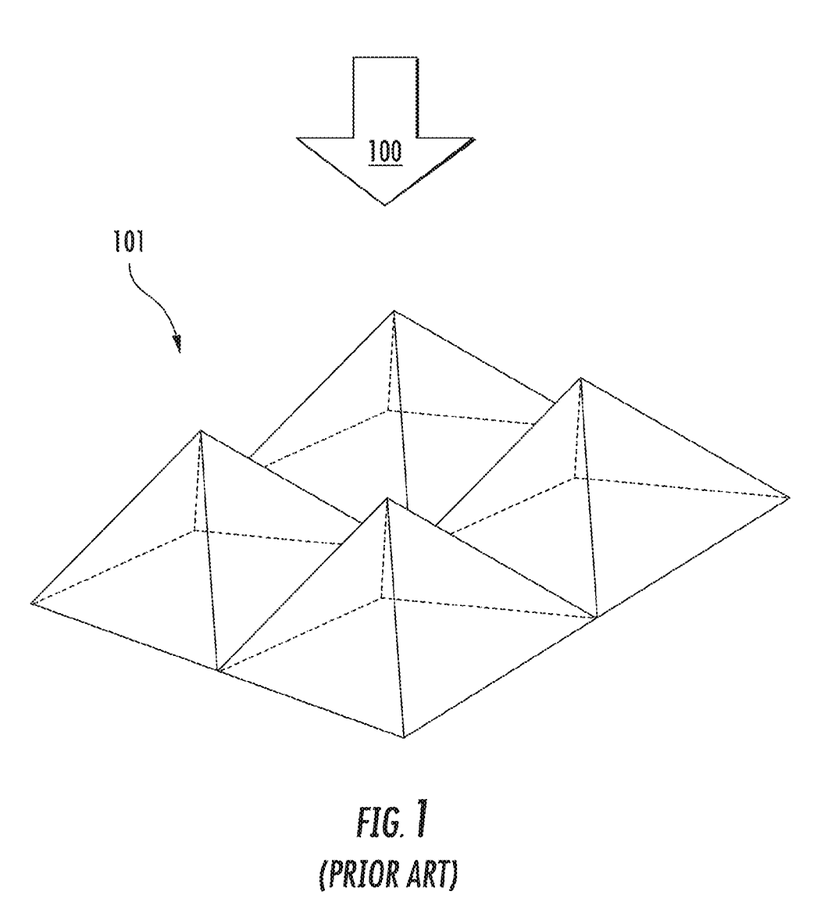
FIG. 1 is a perspective view of implanting a textured workpiece in a first embodiment.

The front surface of solar cells is typically textured to minimize the reflective losses from the surface. A pyramidal texture on the surface may result from an anisotropic etch of a monocrystalline silicon substrate. This etch may use a mixture of KOH and isopropyl alcohol in one instance. FIG. 1 is a perspective view of implanting a textured workpiece in a first embodiment. An ion beam 100 is directed at the textured surface 101 at a normal angle of incidence (i.e., perpendicular to the overall plane formed by the textured surface 101 or plane of the solar cell or other workpiece). Each of the four facets of the textured surface 101 illustrated in FIG. 1 is doped approximately equally. Thus, each facet receives approximately 57.7% of the nominal dose. Multiple implant steps may be required to dope a solar cell with both high and low dopant concentration regions. Additional steps, such as laser ablation or resist patterning and stripping, also may be needed. Such steps may decrease throughput or increase manufacturing costs. Therefore, there is a need in the art for an improved method of solar cell manufacturing and, more particularly, an improved method for ion implantation of solar cells.

SUMMARY

According to a first aspect of the invention, a method of implantation is provided. The method comprises doping a first facet of each of a plurality of pyramids on a surface of a workpiece to a first dose. A second facet and third facet of each of the plurality of pyramids are simultaneously doped to a second dose different than the first dose.

According to a second aspect of the invention, a method of implantation is provided. The method comprises implanting a surface of a workpiece at an angle not perpendicular to the surface. This surface defines a plurality of structures. Each of the plurality of structures defines a first facet, second facet, and third facet. This implanting will simultaneously implant the first facet of each of the plurality of structures with a first dose and the second facet and the third facet of each of the plurality of structures with a second dose smaller than the first dose.

According to a third aspect of the invention, a solar cell is provided. The solar cell comprises a workpiece having a surface that defines a plurality of pyramids. Each of the plurality of pyramids defines at least a first facet, a second facet, and a third facet. Each of the first facets is doped to a first dose and each of the second facets and the third facets is doped to a second dose. The first dose is different than the second dose.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of this method are described herein in connection with an ion implanter. Beam-line ion implanters, plasma doping ion implanters, or flood ion implanters may be used. Any n-type or p-type dopants may be used, but the embodiments herein are not limited solely to dopants. Molecular or atomic ions may be used. Embodiments of this process may be applied to many solar cell architectures or even other workpieces such as semiconductor wafers, flat panels, or light emitting diodes (LEDs). While the embodiments below disclose pyramidal textured surfaces, the embodiments herein may be applied to different textures, structures, or shapes. For example, a similar approach may be applicable to an acid or plasma textured surface that has a different roughness or shape. Thus, the invention is not limited to the specific embodiments described below.

Figure 2A:
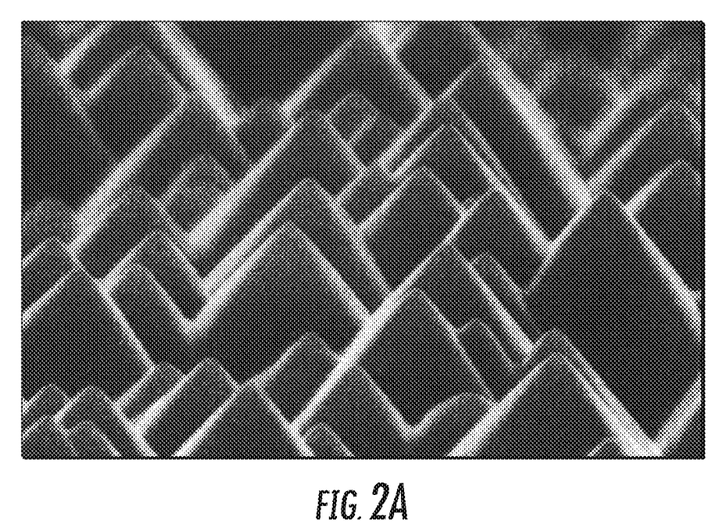
FIGS. 2A-B are views of alkali textured solar cells
Figure 2B:
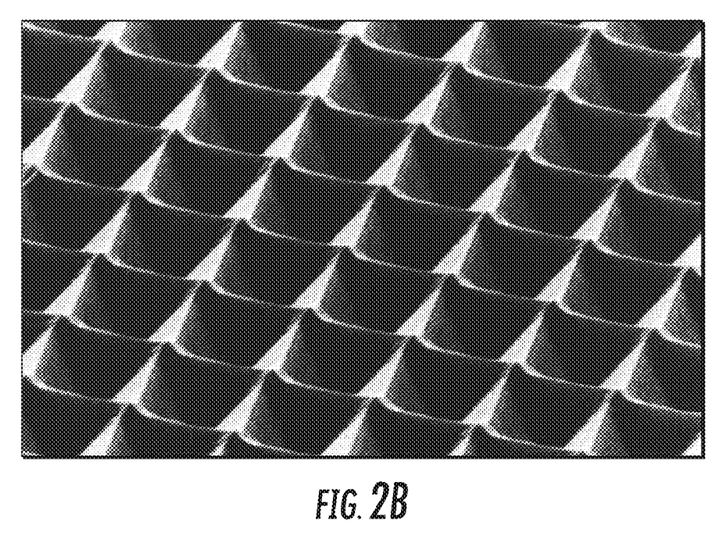

FIGS. 2A-B are views of alkali textured solar cells. FIG. 2A illustrates pyramids. These pyramids may be either uniform or random. FIG. 2B illustrates inverted pyramids, which may be lithographically defined. Pyramids, inverted pyramids, other shapes, and other textured surfaces may benefit from the embodiments described herein. Thus, multiple structures on the workpiece with facets may be implanted.

Figure 3:
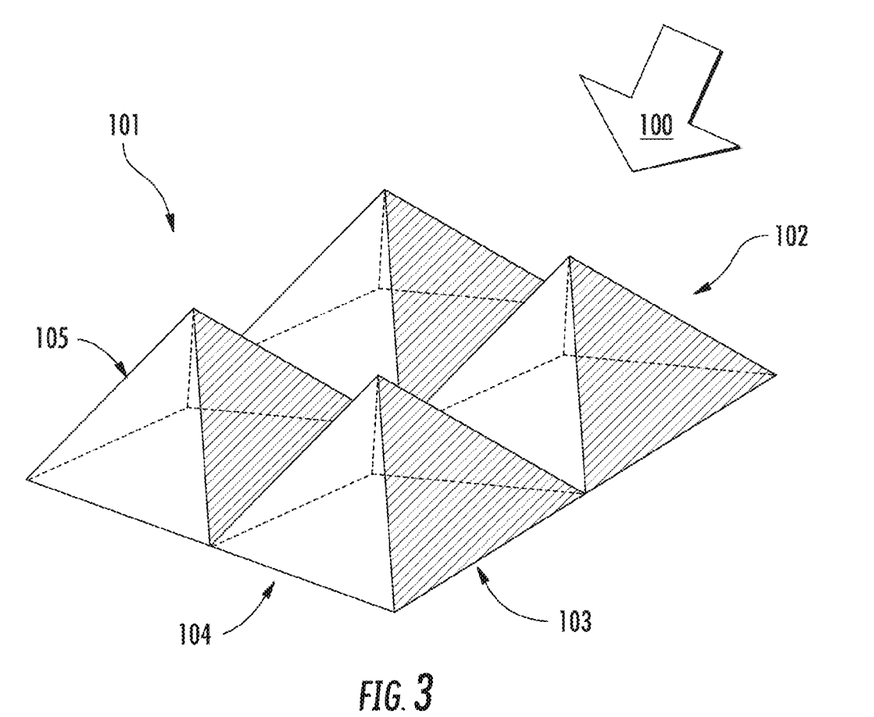
FIG. 3 is a perspective view of implanting a textured workpiece in a second embodiment.

FIG. 3 is a perspective view of implanting a textured workpiece in a second embodiment. Each pyramid in the textured surface 101 of the embodiment of FIG. 3 has four facets 102. The direction of the ion beam 100 is adjusted to differentially dope one or more of these facets 102. Thus, the ion beam 100 is implanted at a non-normal angle with respect to the textured surface 101 (i.e., not perpendicular to the overall plane formed by the textured surface 101 or plane of the solar cell or other workpiece). In one particular embodiment using such an angled implant, the first facets 103 (shaded black in FIG. 3) that "face" the ion beam 100 are more heavily doped.

In a SE solar cell, the first facets 103 may enable low resistance contacts with a metal contact because the dopant concentration near the surface is higher due to the heavier doping on these first facets 103. As the implant angle of the ion beam 100 is varied relative to a normal angle with the textured surface 101, the ion beam 100 may be directed toward one or more facets 102 to distribute the dose unequally on the facets 102 of the textured surface 101. Since the different facets 102 of the pyramids have different doping levels, the overall contact resistance between each pyramid and a metal contact can have a combined resistance of four different resistors in parallel, each corresponding to the four different facets 102 of the pyramid on the textured surface 101. The overall contact resistance between the metal contact and the pyramid may be driven by the lowest value resistor for resistors attached in parallel. The contact resistance may be calculated for various implant angles and any change in contact resistance may be determined. In one particular embodiment, an angled implant using the ion beam 100 on a textured surface 101 provides low contact resistance on SE solar cells.

The other regions of the textured surface 101, such as second facet 104 and third facet 105, are doped less with the ion beam 100 than the first facets 103. The second facet 104 and third facet 105 may enable higher current generation due to the lighter doping on these facets 102 and, hence, lower recombination of generated carriers within the doped layers.

In the embodiment of FIG. 3, the ion beam 100 is implanted at a non-normal angle with respect to the textured surface 101 (i.e., not perpendicular to the overall plane formed by the textured surface 101 or plane of the solar cell or other workpiece). In one particular embodiment using such an angled implant, the facets 102 that "face" the ion beam 100 are more heavily doped. So the "windward" facets 102 receive a higher dose than the "leeward" facets 102. In one instance, a single blanket implant of the entire surface of the solar cell, such as the textured surface 101, may be performed in this manner. Use of a single implant eliminates the need for a second implant or other process steps such as masking. Of course, while only the first facets 103 are illustrated as being more heavily doped, by adjusting the angle of the ion beam 100 or the orientation of the ion beam 100 with respect to the textured surface 101, multiple facets 102 on each pyramid can be more heavily doped than other facets 102 in a single implant step. Or, in an alternate embodiment, the facets 102 are doped to multiple different doses. For example, on each pyramid one facet 102 is doped to a high level, two facets 102 are doped to a medium level, and one facet 102 is doped to a low level.

If the entire surface of the solar cell is implanted using the embodiment illustrated in FIG. 3, an SE solar cell may be formed with approximately 50% of the surface that is more heavily doped (i.e., higher dose on the facets 102 that face the ion beam 100 such as the first facets 103). Of course, approximately 25% or other percentages also may be more heavily doped depending on the ion beam 100 parameters, the dimensions of the textured surface 101, and the implant angle of the ion beam 100.

Figure 4:
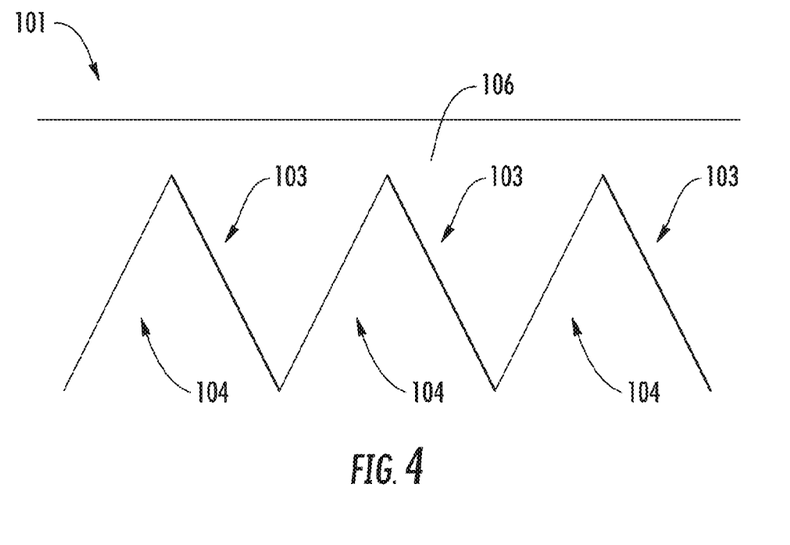
FIG. 4 is a cross-sectional view of the second embodiment of an implanted textured workpiece with metal contacts.

An example of this is illustrated in FIG. 4. FIG. 4 is a cross-sectional view of the second embodiment of an implanted textured workpiece with metal contacts. In FIG. 4, the textured surface 101 includes first facets 103 and second facets 104. While other facets may be part of the textured surface 101, FIG. 4 illustrates only two for simplicity. The first facets 103 are doped more than the second facets 104. A metal contact 106 is applied to the textured surface 101. This metal contact 106 may be applied across only part of the entirety of the textured surface 101 or on only part of the solar cell in one instance. The first facets 103 enable low resistance contacts with the metal contact 106 due to the heavier doping on these first facets 103. The second facets 104 enable higher current generation and an improved blue response due to the lighter doping on these facets. This lighter doping reduces the recombination in the emitter region on these particular facets.

Figure 5:
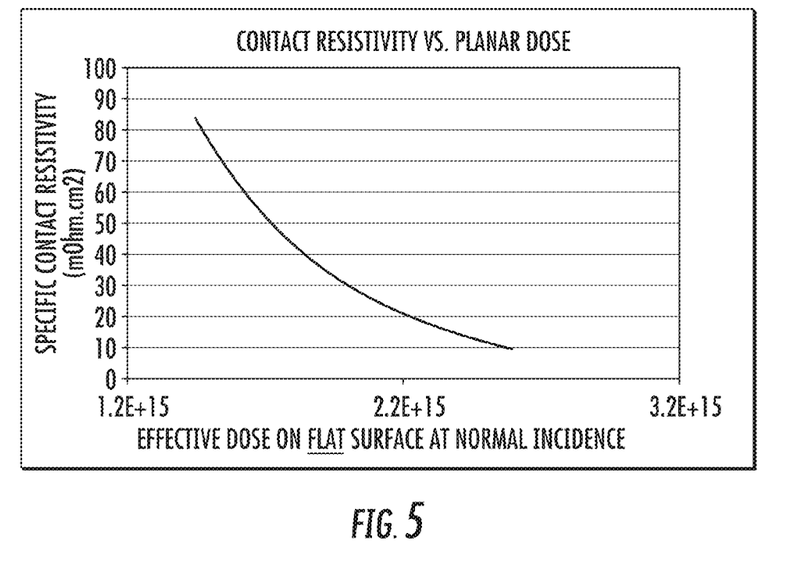
FIG. 5 is a chart comparing specific contact resistance versus effective dose.

Contact resistivity may be sensitive to the implanted dose in the textured surface material. In one example, the textured surface is composed of silicon. Actual sensitivity curves for contact resistivity versus nominal dose depend on the metallization paste and firing conditions. The metallization paste and firing conditions, in turn, depend on the implant dose and annealing conditions. FIG. 5 is a chart comparing specific contact resistance versus effective dose. The line represents estimated contact resistivity. Such variation is for a typical paste and annealing condition. The specific contact resistivity typically trends exponentially as a function of implanted dose. The sensitivity may be experimentally determined and used to calculate the effective contact resistance as a function of implant angle.

Heavier doping or higher surface concentration of dopants results in a lower contact resistance. Thus, heavily doped facets using an angled implant may enable lower overall contact resistance with the metal contacts. Each facet of the pyramid may have a different contact resistivity because specific contact resistance between metal and, for example, a doped silicon layer is a function of doping levels. Specifically, surface concentration affects contact resistance, which is related to the effective dose implanted into the facet.

Figure 6:
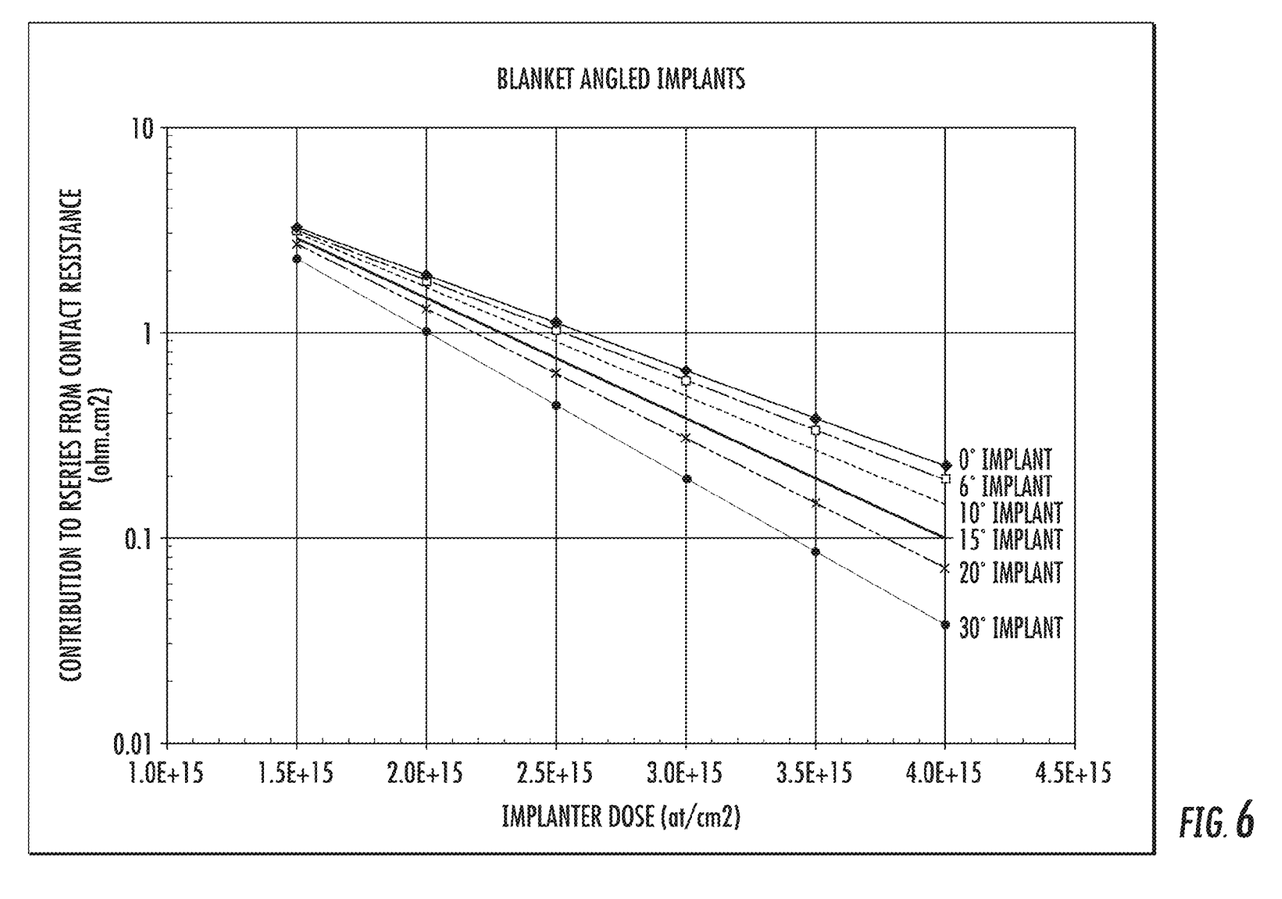
FIG. 6 is a chart comparing the contribution to series resistance from contact resistance to dose.

In a simple example, uniform contact resistance throughout the metal contact is compared to an instance where one half of the total metal contact area has twice the dose of the other half due to a tilted implant directed at two facets of the textured surface. The effective contact resistance for each implanted dose as a function of implant angle may be calculated. FIG. 6 is a chart comparing the contribution to series resistance ($R_{series}$) from contact resistance to dose. FIG. 6 illustrates blanket implants across the textured surface. The nominal implant dose for such a blanket implant will determine the throughput of the implanter. For this nominal implant dose, overall contribution of contact resistance decreases as implant angle is increased.

The limit on incident angle such that all sides of the textured surface are at least partly doped or to have a continuously doped textured surface with the same polarity may be determined. For a pyramidal textured surface, the geometry of the pyramid facets is needed. For a pyramid facet at an angle of approximately 54.7° relative to the plane of the solar cell, the incident angle may be limited to less than 35.3°, or 90° minus the angle of the pyramid facets. This limit enables the formation of a continuously doped layer on the front side with a single blanket implant with no undoped regions caused by shading of the beam by adjacent pyramids. Thus, the surface features of the textured surface may be used to enable differential doping on the textured surface. Alternatively, different implant steps with different incident angles may be used to dope the facets of the textured surface differently. For example, the implant angle, workpiece orientation, or both may be adjusted between implants to target different facets at different incident angles.

Differential doping enables higher current generation in solar cells due to the lightly-doped regions while allowing for contacts to be formed without any alignment requirements during printing of the conductor or metal contact relative to the heavily-doped regions. This alignment step between heavily-doped regions and the conductor or metal contacts to carry the current may be an issue with, for example, SE solar cells. Metal gridlines are typically oriented in an orthogonal grid pattern and the doping pattern should match this grid pattern in both location and orientation. The embodiments disclosed herein eliminate such orientation requirements because the heavily-doped facets for improved contacting are spaced close together and each of the conductors or metal contacts will have access to multiple rows of heavily-doped facets. Thus, a blanket angled implant may be performed and the conductors or metal contacts may be applied anywhere on the surface of the solar cell and still have the benefits of the heavily-doped regions. This may reduce the need for alignment and may increase throughput and yield. It also may enable multiple different screen print or conductive contact application patterns for each ion implanter.

Figure 8:
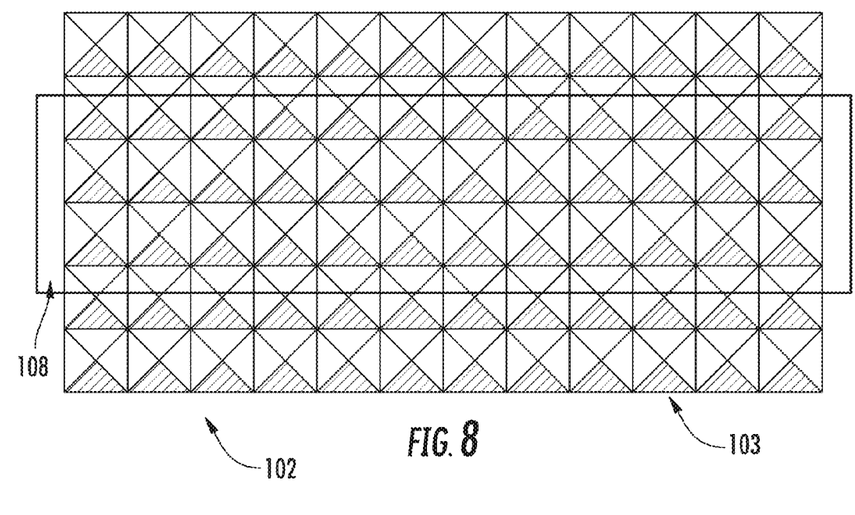
FIG. 8 is a top perspective view of a first embodiment of an implanted textured workpiece.
Figure 9:
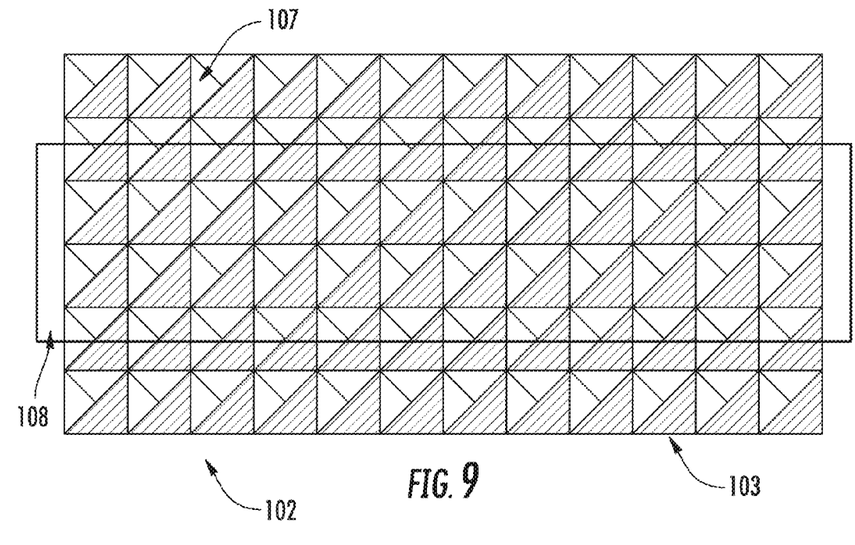
FIG. 9 is a top perspective view of a second embodiment of an implanted textured workpiece.

FIG. 8 is a top perspective view of a first embodiment of an implanted textured workpiece. Each pyramid in the textured surface has four facets 102 in this embodiment. The first facet 103 in each pyramid is darkened in FIG. 8. This first facet 103 is doped more than the other facets 102. FIG. 9 is a top perspective view of a second embodiment of an implanted textured workpiece. Compared to FIG. 8, the first facet 103 and fourth facet 107 are both darkened in FIG. 9. The first facet 103 and fourth facet 107 are doped more heavily than the other facets 102. The relative angle of an ion beam to the solar cell may enable heavier doping of multiple facets 102 in a single implant.

In both FIG. 8 and FIG. 9, a metal contact 108 is applied to the textured surface (illustrated by the shaded region), which includes heavily doped regions and a lightly doped regions. As long as the metal contact 108 is wider than a pyramid, then the metal contact 108 will be disposed on at least one heavily-doped region, such as the first facet 103. This simplifies placement of the metal contact 108 because a pyramid may only be a few μm in width. The width or placement of the metal contact 108 or number of heavily-doped facets 102 can be optimized to increase current generation by having a certain percentage of more heavily-doped facets 102 under the metal contact 108. Also, complicated alignment of the metal contact 108 to a heavily-doped region of the solar cell may be eliminated. The metal contact 108 can be applied anywhere on the textured surface and still be disposed on some heavily-doped regions, such as the first facet 103.

Figure 7:
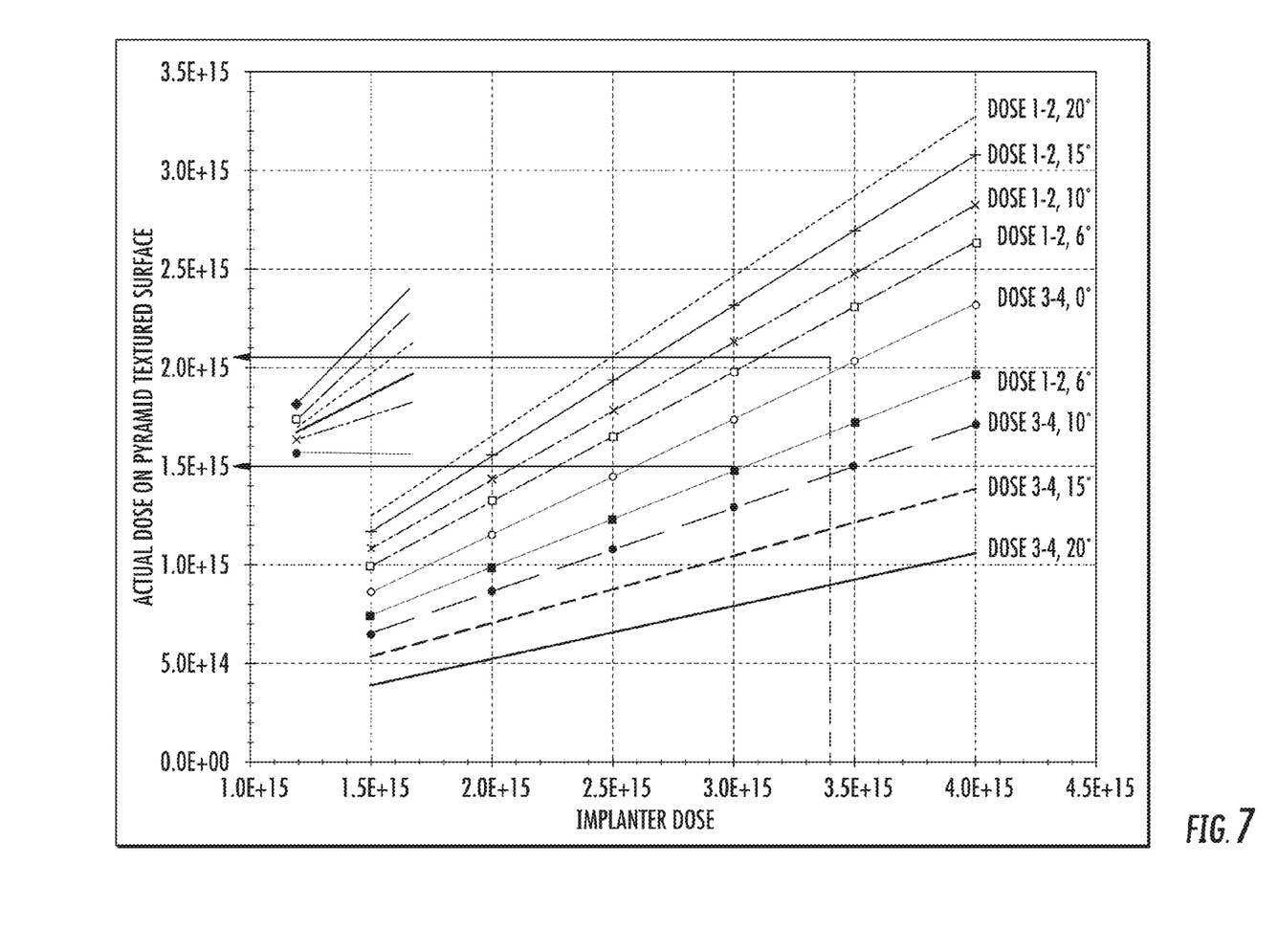
FIG. 7 is a chart comparing actual dose versus implanter dose on different facets of the pyramids when two facets are doped more heavily than the others.

Turning back to FIG. 7, since contact resistance is a limiting factor for driving to higher sheet resistance ($R_{sheet}$) emitters in solar cells, the embodiments described herein may enable lower doses, with associated higher implanter productivity and lower operation costs, while enabling higher performance from the solar cells. As seen in FIG. 7, a horizontal dotted line indicates that as the implant angles are increased such that one or two of the facets receive a more direct strike from the ion beam. The same contribution from contact resistance to $R_{series}$ from the solar cell may be maintained at a lower dose. This enables higher net current generation in a, for example, SE solar cell and, consequently, higher solar cell performance. In an alternate embodiment, either the blanket or field implant or the contact implant may be performed at an angle so as to enable contacting at a lower effective dose. The angled implant may be tilted at one angle or two or more angles. For two angles, the angles may be adjusted during implant like a bimode implant or adjusted to be asymmetric, such as having one implant at 30° and the second implant at 10°, both with approximately half the nominal dose. Of course, various other combinations are possible. In other embodiments, a tilted blanket implant is combined with a normal selective implant, a normal blanket implant is combined with a tilted selective implant, or other combinations.

Another benefit of having slightly higher dopant concentrations on the facets in close proximity with each other may be an improvement in gettering efficiency of the emitters. For example, the amount of iron gettered from the bulk is related to the concentration of the phosphorus near the surface because iron is drawn to high phosphorus concentration regions. This is at least partly due to iron's increased solubility in the phosphorus-doped silicon. Other dopants besides phosphorus that getter iron also may be used. In a traditional SE solar cell, the heavily-doped regions are spaced approximately 1 to 3 mm apart, such as under the metal contact. Metallic contaminants need a larger diffusion length to move to these gettering sites or high phosphorus concentration regions. In the embodiments disclosed herein, the heavily-doped regions are located closer together because is pyramid spacing may be approximately 5-20 μm, which eliminates any diffusion limitations due to lateral spacing of the gettering sites. This may improve gettering efficiency for the same thermal cycles or enable a reduced thermal cycle for the same gettering efficiency and may improve the overall line throughput by reducing the thermal cycle for the wafers.

FIG. 7 is a chart comparing actual dose versus implanter dose on different facets of the pyramids when two facets are doped more heavily than the others. The embodiment of FIG. 7 shows equivalent dose combinations corresponding to a blanket implant at different tilt angles as a function of the nominal implanted dose. For example, at any tilt angle the equivalent implanter dose at a given tilt angle is determined by drawing horizontal lines through the point of intersection of a vertical line (through the implanter dose) where it intersects the two curves corresponding to the tilt angle. Thus, the facet facing the ion beam receives a higher dose than other facets. The legend refers to 1-2 and 3-4, which corresponds to facets of the pyramid-shaped textured surface. As illustrated by FIG. 7, varying the implant angle changes the actual dose received by the various facets. Facets opposite or "leeward" of the ion beam receive less than the "windward" facets facing the ion beam. In contrast, at a 0° angle of incidence, all facets receive the same dose.

Optimizing the implant angle and nominal dose may enable higher solar cell efficiencies. Contacting is improved by the heavily-doped facets while current generation is enabled via the lightly-doped facets. Gettering also may be improved, which results in additional current generation, because the heavily-doped regions may only be approximately 5 μm to 10 μm apart. Reduced implant dose may be enabled, which increases implanter throughput and productivity. Fewer implant steps may be required and complicated masking may be avoided if blanket implants using embodiment described herein are used.

In one particular embodiment, a 3.0E15 cm$^{-2}$ implant is performed at a 15° implant angle. This is equivalent to having a selective emitter cell with a pitch of approximately 10 μm with a heavily-doped region of 4.0E15 cm$^{-2}$ and a lightly-doped region of 1.8E15 cm$^{-2}$.

The tilted implants disclosed herein may be field implants, contact implants, or both. The heavily-doped regions on the textured surface may be oriented at any angle relative to the conductors or metal contacts that are later applied to the solar cell. Thus, the conductors or metal contacts may be, for example, parallel or perpendicular to the heavily-doped regions.

The embodiment disclosed herein may be applied to multiple crystal structures. Depending on the energy of the implant and the crystal structure, channeling into the pyramids may occur. However, for an implant into silicon pyramids, channeling may be reduced or eliminated due to the orientation of the crystal lattice. This silicon crystal lattice may substantially prevent channeling of ions between the silicon atoms.

The ion beam may be implanted at an angle with respect to the solar cell in multiple ways. The ion beam may be deflected or otherwise angled, such as using an optical lens. The solar cell can be tilted with respect to the ion beam on a platen or other workpiece holding device. A combination of ion beam deflection and tilting the solar cell also are possible. Other methods known to those skilled in the art also may be used.

The embodiments disclosed herein may be applied to an interdigitated backside contact (IBC) solar cell. In such a case, a selective angled implant is used to form both the n-type and p-type regions of the IBC solar cell. The selective implant for each region may use, for example, photoresist or a proximity mask. Similar to SE solar cells, this may improve contacting for IBC solar cells.

While ion implantation is specifically discussed, the directional nature of the embodiments disclosed herein also may be applied to other doping methods such as sputtering or with directional annealing methods such as lasers. For example, a laser could be used at a non-normal incident angle to differentially activate a dopant. In another example, directional deposition of a dopant-containing film may be enabled using the embodiments disclosed herein. This may be enabled with deposition techniques such as remote plasma chemical vapor deposition (CVD), sputter deposition, or other physical vapor deposition (PVD) techniques which are directional and may be used to optimize the anti-reflective properties on the differentially doped facets.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece using implantation comprising:
    doping a first facet of each of a plurality of pyramids on a surface of a workpiece to a first dose;
    simultaneously doping a second facet and a third facet of each of said plurality of pyramids to a second dose different than said first dose; and
    applying a plurality of metal contacts to said surface of said workpiece, while said first facets have a different dose than said second and third facets.

2. The method of claim 1, wherein said workpiece is a solar cell.

3. The method of claim 1, wherein said doping is at an angle not perpendicular to said workpiece.

4. The method of claim 1, wherein said first facet has a lower resistance than said second facet and said third facet.

5. The method of claim 1, wherein said second dose is configured to enable lower recombination of generated carriers in said second facet and said third facet.

6. The method of claim 1, wherein less than 50% of said surface is doped to said first dose.

7. The method of claim 1, wherein said doping is selected from the group consisting of ion implantation, laser doping, sputtering, and deposition.

8. The method of claim 1, wherein said plurality of metal contacts is applied to a plurality of said first facets, said second facets and said third facets on said surface of said workpiece.

9. The method of claim 1, wherein an entirety of said surface is doped to either said first dose or said second dose by said doping and said simultaneously doping.

10. The method of claim 1, further comprising doping a fourth facet of each of said plurality of pyramids on said surface of said workpiece to said first dose simultaneously with said doping of said first facet.

11. A method of processing a workpiece using implantation comprising:
    implanting a surface of a workpiece at an angle not perpendicular to said surface, said surface defining a plurality of structures, each of said plurality of structures defining a first facet, second facet, and third facet, wherein said implanting will implant said first facet of each of said plurality of structures with a first dose and said implanting will simultaneously implant said second facet and said third facet of each of said plurality of structures with a second dose smaller than said first dose; and
    applying a plurality of metal contacts to said surface of said workpiece, while said first facets have a different dose than said second and third facets.

12. The method of claim 11, wherein said workpiece is a solar cell and each of said plurality of structures is a pyramid.

13. The method of claim 11, wherein said first facet has a lower resistance than said second facet and said third facet.

14. The method of claim 11, wherein said second dose is configured to enable lower recombination of generated carriers in said second facet and said third facet.

15. The method of claim 11, wherein less than 50% of said surface is implanted to said first dose.

16. The method of claim 11, wherein said plurality of metal contacts is applied to said structures on said surface of said workpiece.

17. The method of claim 11, wherein an entirety of said surface has either said first dose or said second dose due to said implanting.

18. The method of claim 11, wherein each of said plurality of structures further defines a fourth facet, and wherein said fourth facet of each of said plurality of structures is implanted with said first dose simultaneously with said first facet.

* * * * *